US007686480B2

(12) United States Patent
Chien et al.

(10) Patent No.: US 7,686,480 B2
(45) Date of Patent: Mar. 30, 2010

(54) LIGHT VALVE DEVICE

(75) Inventors: Chao-Nan Chien, Hsinchu (TW); Wei-Cheng Lo, Hsinchu (TW)

(73) Assignee: Coretronic Corporation (TW)

( * ) Notice: Subject to any disclaimer, the term of this patent is extended or adjusted under 35 U.S.C. 154(b) by 231 days.

(21) Appl. No.: 12/055,591

(22) Filed: Mar. 26, 2008

(65) Prior Publication Data

US 2008/0247168 A1 Oct. 9, 2008

(30) Foreign Application Priority Data

Apr. 9, 2007 (TW) .............................. 96112407 A

(51) Int. Cl.
*F21V 29/00* (2006.01)
*H05K 7/20* (2006.01)

(52) U.S. Cl. ........................ 362/294; 362/373; 361/709

(58) Field of Classification Search ................. 362/294, 362/373, 345, 264, 218, 126, 547, 580; 361/702–719
See application file for complete search history.

(56) References Cited

U.S. PATENT DOCUMENTS 6,517,218 B2 * 2/2003 Hochstein ................... 362/294
6,914,783 B2 * 7/2005 Rogers et al. ............... 361/709
6,999,318 B2 * 2/2006 Newby ....................... 361/719
7,264,378 B2 * 9/2007 Loh ........................... 362/294
7,513,639 B2 * 4/2009 Wang ......................... 362/218
7,549,773 B2 * 6/2009 Lim ........................... 362/294

FOREIGN PATENT DOCUMENTS

CN 2645124 9/2004
TW 447735 7/2001
TW 492621 6/2002
TW M282478 12/2005

* cited by examiner

*Primary Examiner*—Bao Q Truong
(74) *Attorney, Agent, or Firm*—Banner & Witcoff, Ltd.

(57) ABSTRACT

A light valve device includes a light valve disposed adjacent to a circuit board, and a heat-dissipating structure including a heat-dissipating main body and a heat-dissipating block. The heat-dissipating main body is disposed opposite to the light valve, and is formed with a groove defined by a first contacting surface and two engaging surfaces. The first contacting surface extends in a longitudinal direction perpendicular to the vertical direction and has two opposite longitudinal edges. The engaging surfaces respectively extend from the longitudinal edges and define an open side of the groove opposite to the first contacting surface in the vertical direction. The open side has a width in the transverse direction smaller than that of the first contacting surface. An engaging portion of the heat-dissipating block is disposed in the groove so that a second contacting surface is in contact with the first contacting surface.

14 Claims, 9 Drawing Sheets

LIGHT VALVE DEVICE

CROSS-REFERENCE TO RELATED APPLICATION

This application claims priority of Taiwanese Application No. 096112407, filed on Apr. 9, 2007.

BACKGROUND OF THE INVENTION

1. Field of the Invention

The invention relates to a projection system, more particularly to a light valve device suitable for a projection system.

2. Description of the Related Art

Since the projection image quality of a projection system is directly affected by a light valve in the projection system, it is extremely important to maintain a suitable operating temperature of the light valve. With reference to FIG. 1 and FIG. 2, a conventional light valve device 1 includes a light valve 11 disposed on a supporting seat 12, which is disposed on a first side of a circuit board 13. A heat-dissipating structure 14 is disposed on a second side of the circuit board 13 opposite to the first side. The heat-dissipating structure 14 includes a heat-dissipating main body 141 and a heat-dissipating block 142. The heat-dissipating main body 141 includes a plurality of heat-dissipating fins 143. A heat-dissipating sheet 15 interconnects the heat-dissipating block 142 and the light valve 11. Heat generated by the light valve 11 is transferred into the air via the heat-dissipating block 142 and the heat-dissipating main body 141, thereby cooling the light valve 11.

The heat-dissipating structure 14 is normally made of aluminum, which is relatively lightweight. However, since the operating temperature of the light valve 11 becomes increasingly higher as demand for luminance in images projected by the projection system increases, aluminum is being replaced with copper or other materials having better heat conductivity so as to improve the heat-dissipating capability of the heat-dissipating structure 14. However, since copper is more costly and is heavier than aluminum, a common practice is to only make the heat-dissipating block 142 be made of copper, while the heat-dissipating main body 141 is still made of aluminum.

However, when the heat-dissipating main body 141 and the heat-dissipating block 142 are made of different materials, engagement therebetween becomes difficult. Two engaging methods for the heat-dissipating main body 141 and the heat-dissipating block 142 are used at present. One engaging method involves soldering the heat-dissipating block 142 to the heat-dissipating main body 141. However, the cost of soldering is high, and the durability of the heat-dissipating structure 14 decreases. The second engaging method involves locking the heat-dissipating block 142 to the heat-dissipating main body 141 via screw fasteners (not shown). However, not only do screw fasteners degrade the heat-dissipating capability of the heat-dissipating structure 14, but formation of screw holes and screw threads and locking of the screw fasteners also increase the manufacturing cost of the conventional light valve device 1. Moreover, since loosening of the screw fasteners is difficult to detect, the stability of the heat-dissipating structure 14 is adversely affected.

SUMMARY OF THE INVENTION

Therefore, an object of the present invention is to provide a light valve device that has enhanced heat-dissipating structural durability and that provides more efficient heat-dissipating capability.

Another object of the present invention is to provide a light valve device that is low cost, lightweight, and efficient in heat dissipation.

According to an embodiment of the present invention, a light valve device is provided and includes a circuit board, a light valve and a heat-dissipating structure.

The circuit board has a first surface and a second surface opposite to the first surface in a vertical direction. The circuit board is formed with a through hole that extends from the first surface to the second surface in the vertical direction.

The light valve is disposed adjacent to the first surface of the circuit board.

The heat-dissipating structure includes a heat-dissipating main body and a heat-dissipating block. The heat-dissipating main body has a first side. The first side is disposed adjacent to the second surface of the circuit board, and is formed with a groove defined by a first contacting surface and two engaging surfaces. The first contacting surface extends in a longitudinal direction perpendicular to the vertical direction, and has two longitudinal edges that are opposite to each other in a transverse direction perpendicular to the vertical and longitudinal directions. The engaging surfaces respectively extend from the longitudinal edges of the first contacting surface, and define an open side of the groove opposite to the first contacting surface in the vertical direction. The groove extends in the longitudinal direction through two opposite lateral sides of the heat-dissipating main body transverse to the first side. The open side of the groove has a width in the transverse direction smaller than that of the first contacting surface in the transverse direction. The heat-dissipating block includes an engaging portion and a heat-dissipating portion connected to the engaging portion. The engaging portion has a second contacting surface, and is disposed in the groove so that the second contacting surface is in contact with the first contacting surface of the first side of the heat-dissipating main body. The heat-dissipating portion extends through the through hole in the circuit board toward the light valve.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
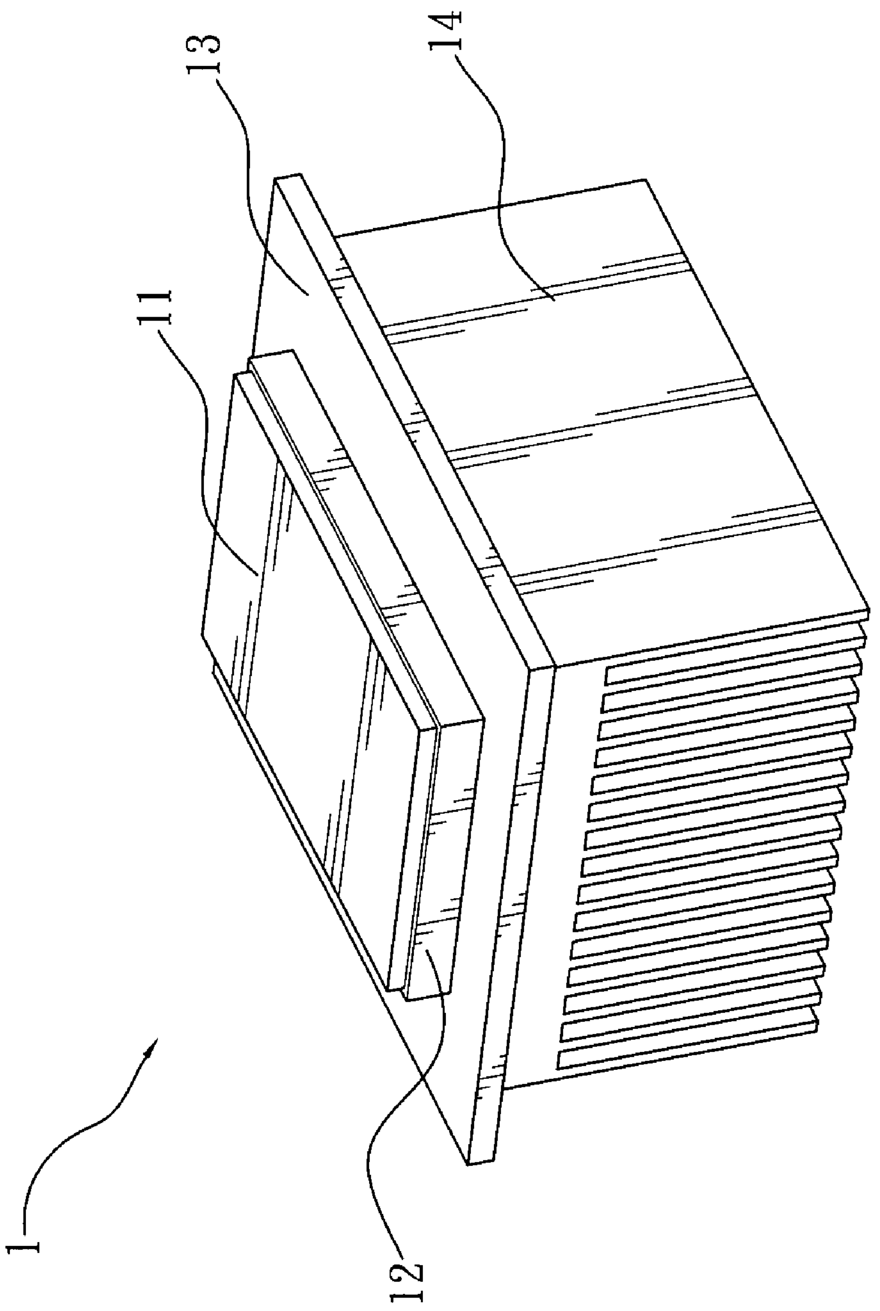
FIG. 1 PRIOR ART
FIG. 1 is a perspective view of a conventional light valve device.
Figure 2:
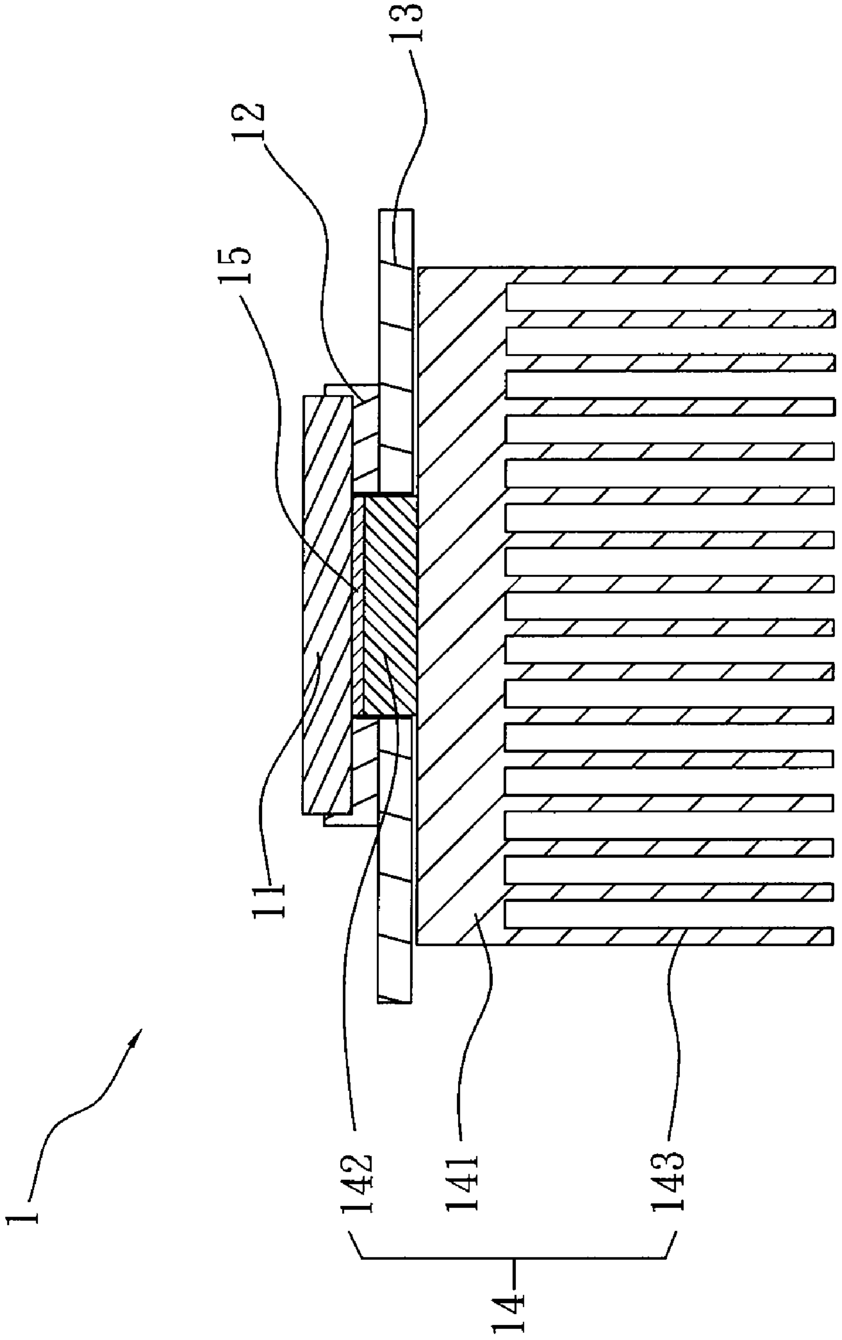
FIG. 2 PRIOR ART
FIG. 2 is a sectional view of the conventional light valve device.

Before the present invention is described in greater detail, it should be noted that like elements are denoted by the same reference numerals throughout the disclosure.

In the following detailed description of the preferred embodiments, reference is made to the accompanying drawings which form a part hereof, and in which there are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein are meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component faces "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 3A:
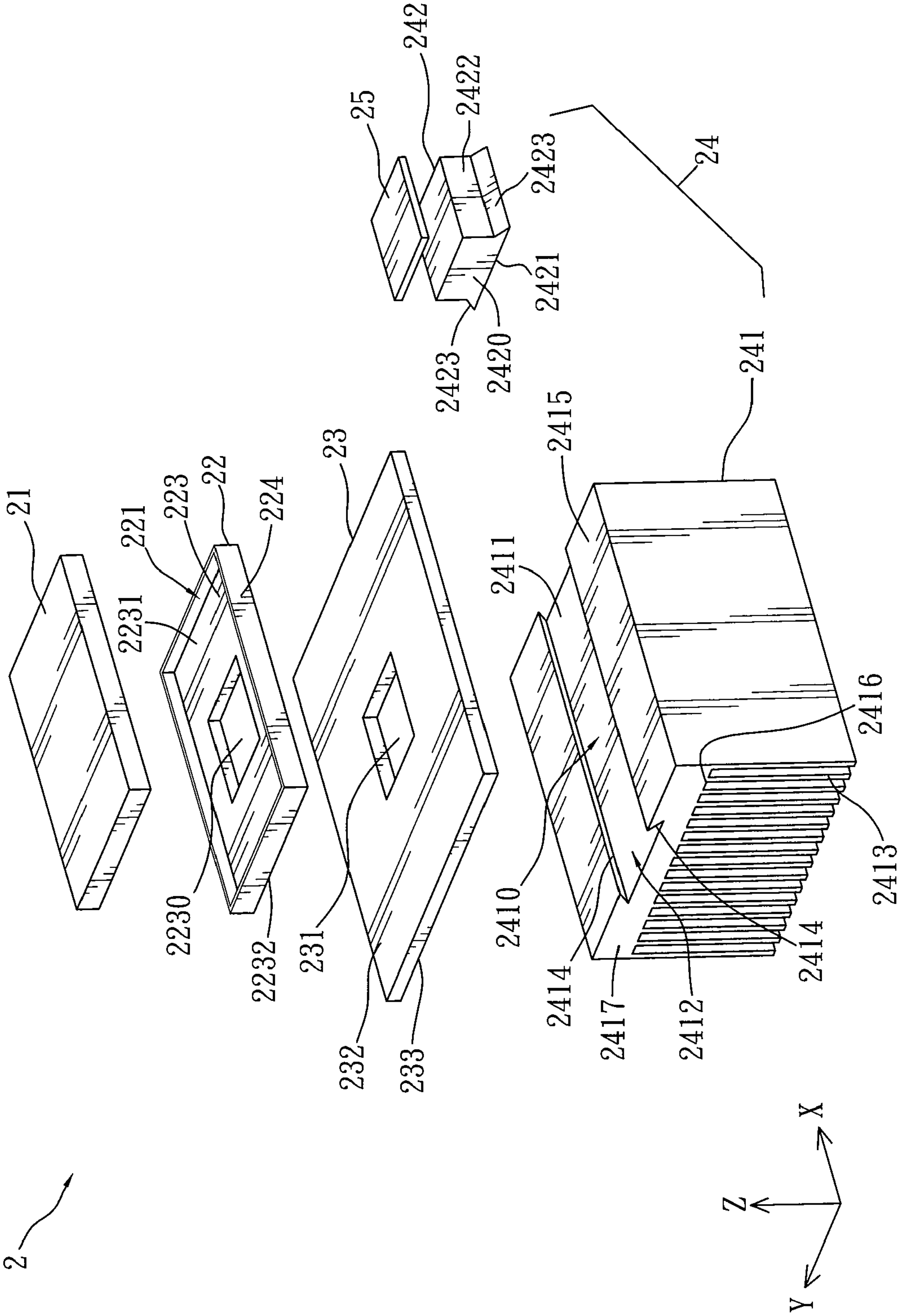
FIG. 3A is an exploded perspective view of a light valve device according to the first preferred embodiment of the present invention.
Figure 3B:
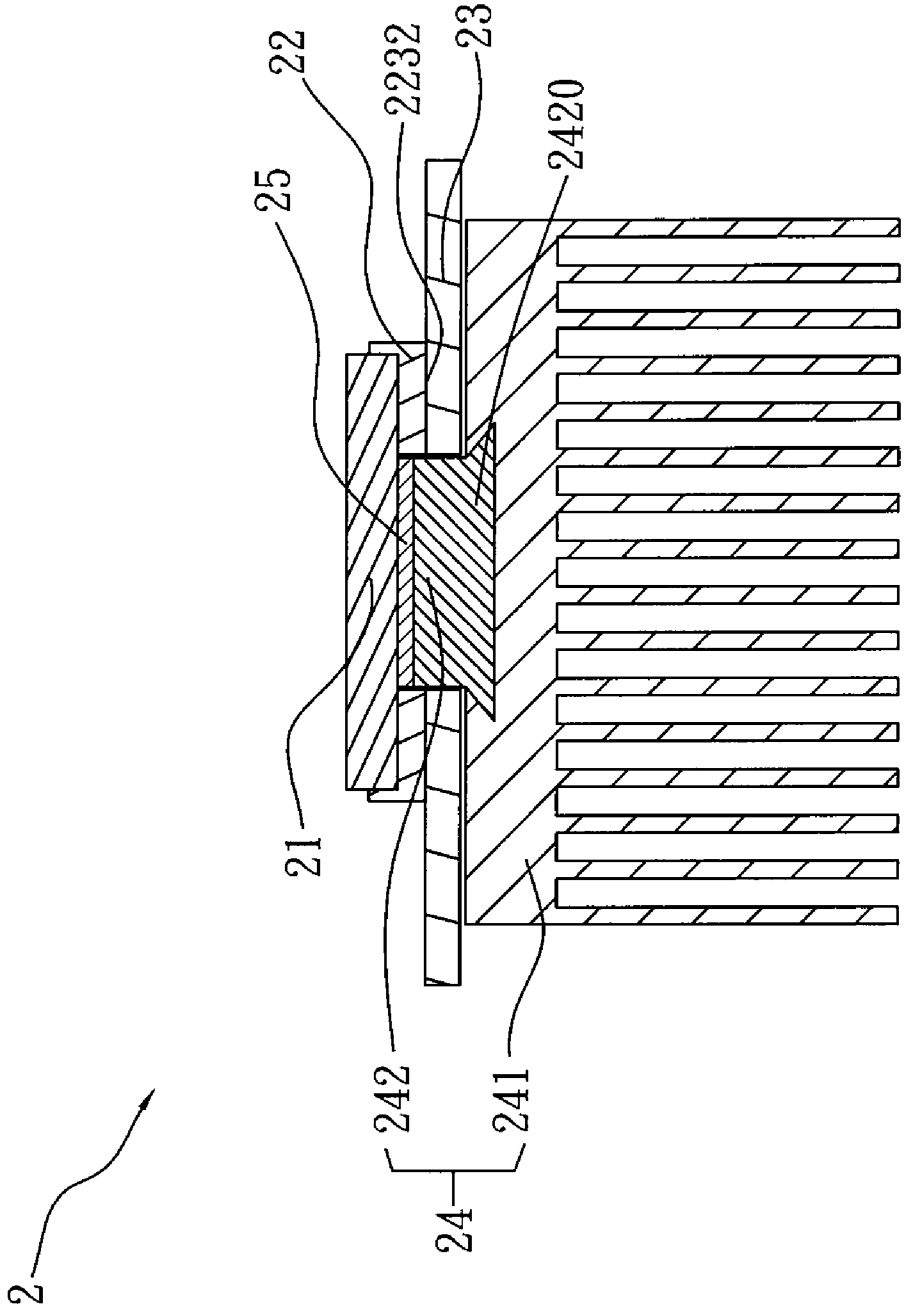
FIG. 3B is a sectional view of the first preferred embodiment.

With reference to FIG. 3A and FIG. 3B, a light valve device 2 according to a first preferred embodiment of the present invention is adapted for use in a projection system (not shown). The light valve device 2 includes a circuit board 23, a light valve 21, a valve-receiving seat 22, a heat-dissipating structure 24, and a heat-conducting plate 25.

The circuit board 23 has a first surface 232 and a second surface 233 opposite to the first surface 232 in a vertical direction (Z). The circuit board 23 has a first through hole 231 that extends from the first surface 232 to the second surface 233 in the vertical direction (Z). The circuit board 23 is, for example, a printed circuit board.

The light valve 21 is disposed adjacent to the first surface 232 of the circuit board 23, and has a center corresponding to the first through hole 231 in the circuit board 23. The light valve 21 is, for example, a digital micromirror device (DMD) unit.

The valve-receiving seat 22 includes a seat wall 223, and a surrounding wall 224 connected to and cooperating with the seat wall 223 to define a valve-receiving space 221. The seat wall 223 has a first face 2231 that faces the valve-receiving space 221, and a second face 2232 that is opposite to the first face 2231 in the vertical direction (Z) and that is disposed in contact with the first surface 232 of the circuit board 23. The light valve 21 is received in the valve-receiving space 221, is in contact with the first face 2231 of the seat wall 223, and is coupled electrically to the circuit board 23 via the valve-receiving seat 22. The seat wall 223 of the valve-receiving seat 22 is formed with a second through hole 2230 that extends from the first face 2231 to the second face 2232, and that corresponds to the first through hole 231 in the circuit board 23.

The heat-dissipating structure 24 includes a heat-dissipating main body 241 and a heat-dissipating block 242. The heat-dissipating main body 241 has a first side 2415. The first side 2415 is disposed adjacent to the second surface 233 of the circuit board 23, and is formed with a groove 2410 defined by a first contacting surface 2411 and two engaging surfaces 2414. The first contacting surface 2411 extends in a longitudinal direction (X) perpendicular to the vertical direction (Z), and has two longitudinal edges that are opposite to each other in a transverse direction (Y) perpendicular to the vertical and longitudinal directions (Z), (X). The engaging surfaces 2414 respectively extend from the longitudinal edges of the first contacting surface 2411 and define an open side 2412 of the groove 2410 opposite to the first contacting surface 2411 in the vertical direction (Z). The groove 2410 extends in the longitudinal direction (X) through two opposite lateral sides 2417 (only one of which is visible in FIG. 3A) of the heat-dissipating main body 241 that are transverse to the first side 2415. The open side 2412 of the groove 2410 has a width in the transverse direction (Y) smaller than that of the first contacting surface 2411 in the transverse direction (Y). The heat-dissipating main body 241 further has a second side 2416 opposite to the first side 2415 in the vertical direction (Z), and is provided with a plurality of heat-dissipating fins 2413.

The heat-dissipating block 242 includes an engaging portion 2420 and a heat-dissipating portion 2422 connected to the engaging portion 2420. The engaging portion 2420 has a second contacting surface 2421, and is disposed in the groove 2410 so that the second contacting surface 2421 is in contact with the first contacting surface 2411 of the first side 2415 of the heat-dissipating main body 241. The heat-dissipating portion 2422 extends through the first through hole 231 in the circuit board 23 and the second through hole 2230 in the seat wall 223 of the valve-receiving seat 22 toward the light valve 21. The second contacting surface 2421 of the heat-dissipating block 242 has an area smaller than that of the first side 2415 of the heat-dissipating main body 241.

The heat-conducting plate 25 is disposed between the light valve 21 and the heat-dissipating portion 2422 of the heat-dissipating block 242.

In this embodiment, the groove 2410 in the heat-dissipating main body 241 is a dovetail groove, and the engaging portion 2420 of the heat-dissipating block 242 is a dovetail joint corresponding in shape to the dovetail groove. In particular, each of the engaging surfaces 2414 of the heat-dissipating main body 241 forms a wedge-shaped outline with the first contacting surface 2411 in a plane perpendicular to the longitudinal direction (X), thereby making the width of the open side 2412 of the groove 2410 in the transverse direction (Y) smaller than that of the first contacting surface 2411 in the transverse direction (Y). In addition, the engaging portion 2420 of the heat-dissipating block 242 has two wedge-shaped projections 2423 respectively corresponding in shape to the wedge-shaped outlines formed by the engaging surfaces 2414 with the first contacting surface 2411. When the engaging portion 2420 is slid into the groove 2410 in the heat-dissipating main body 241 along the longitudinal direction (X) and is eventually disposed at a suitable position, forces may be applied to deform the engaging surfaces 2414 of the heat-dissipating main body 241 so that the heat-dissipating block 242 is engaged fixedly to the heat-dissipating main body 241 at the suitable position. Therefore, the heat-dissipating main body 241 and the heat-dissipating block 242, which are made of different materials, are engaged to each other and are disposed in contact with each other using a method that is fast, that provides a low thermal resistance, and that is low cost.

Moreover, the heat-dissipating block 242 has a thermal conductivity greater than that of the heat-dissipating main body 241. In this embodiment, the heat-dissipating block 242 is made of copper or silver, and the heat-dissipating main body 241 is made of aluminum. However, the manufacturing materials are not limited to those disclosed herein in other embodiments of the present invention. For instance, the heat-dissipating main body 241 may be formed by aluminum extrusion, and the heat-dissipating block 242 may be formed by copper extrusion or forging.

Since the thermal conductivity of the heat-dissipating block 242 is greater than that of the heat-dissipating main body 241, and a lower thermal resistance exists between the heat-dissipating main body 241 and the heat-dissipating block 242 as the two are disposed in contact with each other, heat energy generated by the light valve 21 is transferred quickly to the air via the heat-dissipating block 242 and the heat-dissipating main body 241. Therefore, heat-dissipating efficiency of the light valve device 2 is enhanced as compared to the prior art. In addition, the disadvantages of poor structural durability, slow heat-dissipating rate, and the existence of high thermal resistance present in the prior art which uses the method of soldering and screw fasteners are eliminated in the embodiment of the present invention. As a result, the light valve 21 of the light valve device 2 according to the embodiment of the present invention is provided with a well-maintained operating temperature, thereby ensuring quality of the images projected by a projection system (not shown) incorporating the light valve device 2.

Figure 4A:
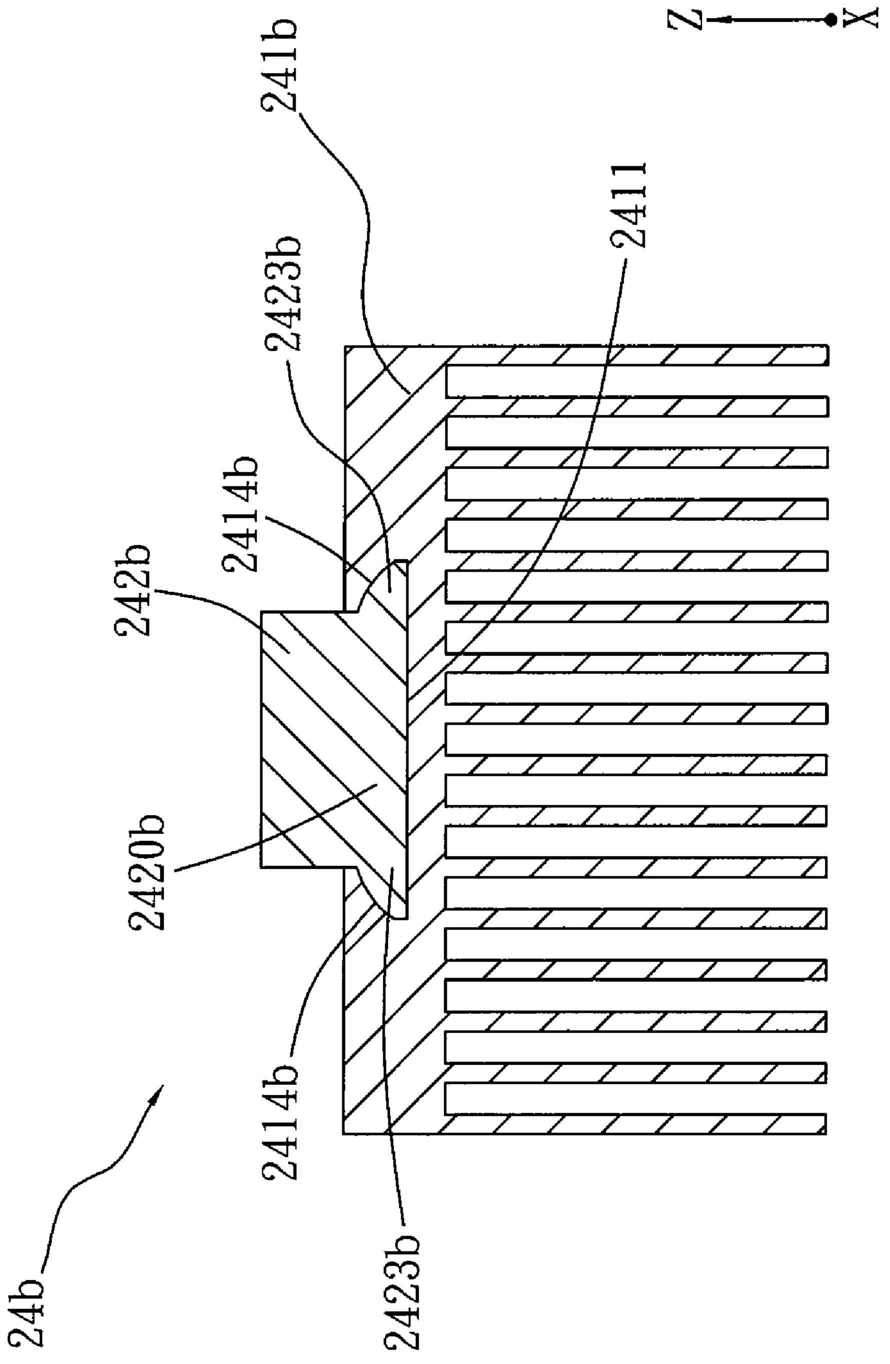
FIG. 4A is a sectional view of a heat-dissipating structure according to the second preferred embodiment of the present invention.
Figure 4B:
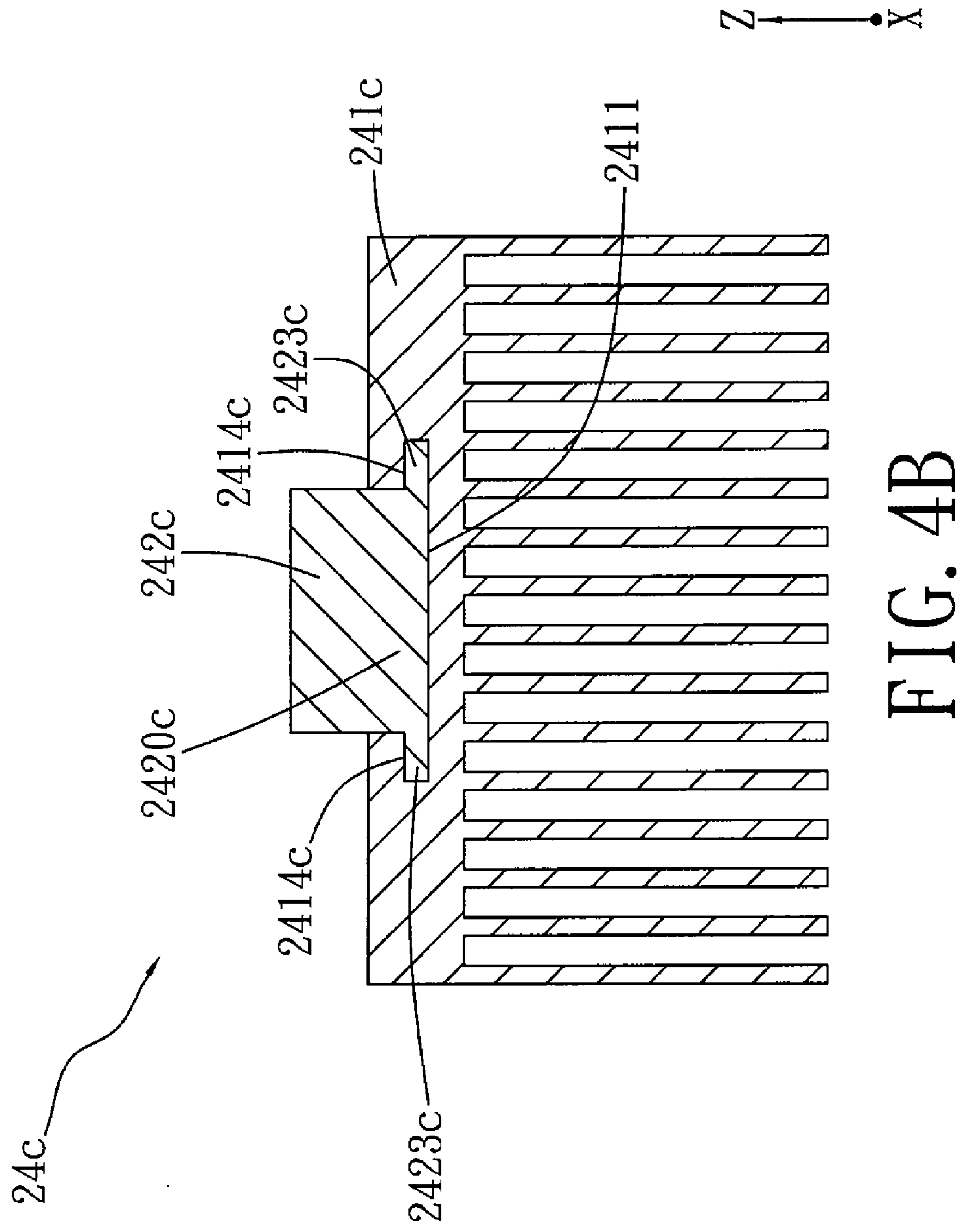
FIG. 4B is a sectional view of the heat-dissipating structure according to the third preferred embodiment of the present invention.

However, the configurations of the heat-dissipating main body 241 and of the heat-dissipating block 242 are not limited to those disclosed hereinabove. With reference to FIG. 4A, according to a second preferred embodiment of the present invention, each of the engaging surfaces 2414*b* of the heat-dissipating main body 241*b* of the heat-dissipating structure 24*b* forms a fan-shaped outline with the first contacting surface 2411 in a plane perpendicular to the longitudinal direction (X), and the engaging portion 2420*b* of the heat-dissipating block 242*b* has two fan-shaped projections 2423*b* respectively corresponding in shape to the fan-shaped outlines formed by the engaging surfaces 2414*b* with the first contacting surface 2411. With reference to FIG. 4B, according to a third preferred embodiment of the present invention, each of the engaging surfaces 2414*c* of the heat-dissipating main body 241*c* of the heat-dissipating structure 24*c* forms a rectangular-shaped outline with the first contacting surface 2411 in a plane perpendicular to the longitudinal direction (X), and the engaging portion 2420*c* of the heat-dissipating block 242*c* has two rectangular-shaped projections 2423*c* respectively corresponding in shape to the rectangular-shaped outlines formed by the engaging surfaces 2414*c* with the first contacting surface 2411. Since the advantages achieved by the heat-dissipating structures 24*b*, 24*c* are identical to those described in connection with the heat-dissipating structure 24 of the first preferred embodiment, further details of the same are omitted herein for the sake of brevity.

Figure 5A:
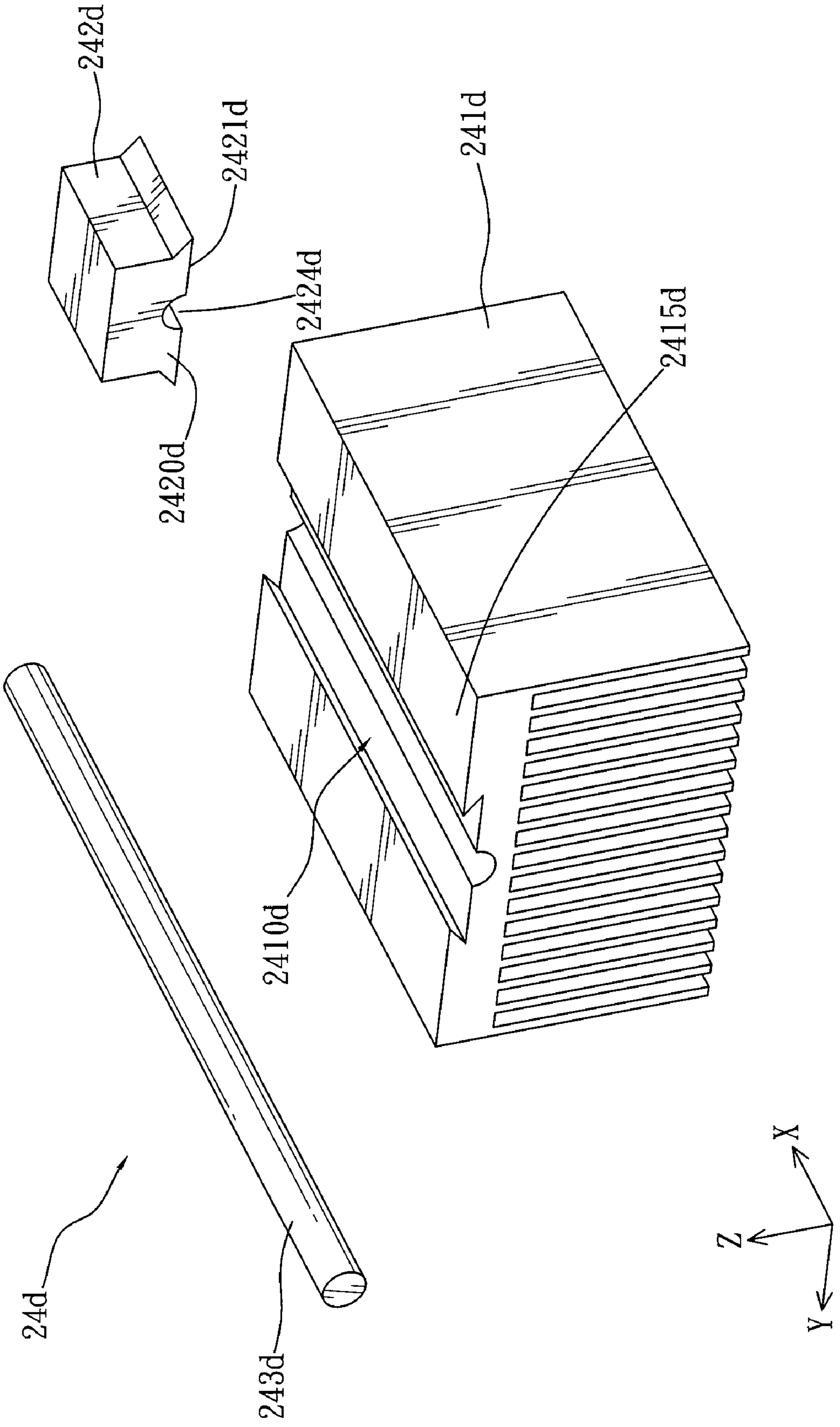
FIG. 5A is an exploded perspective view of the heat-dissipating structure according to the fourth preferred embodiment of the present invention.
Figure 5B:
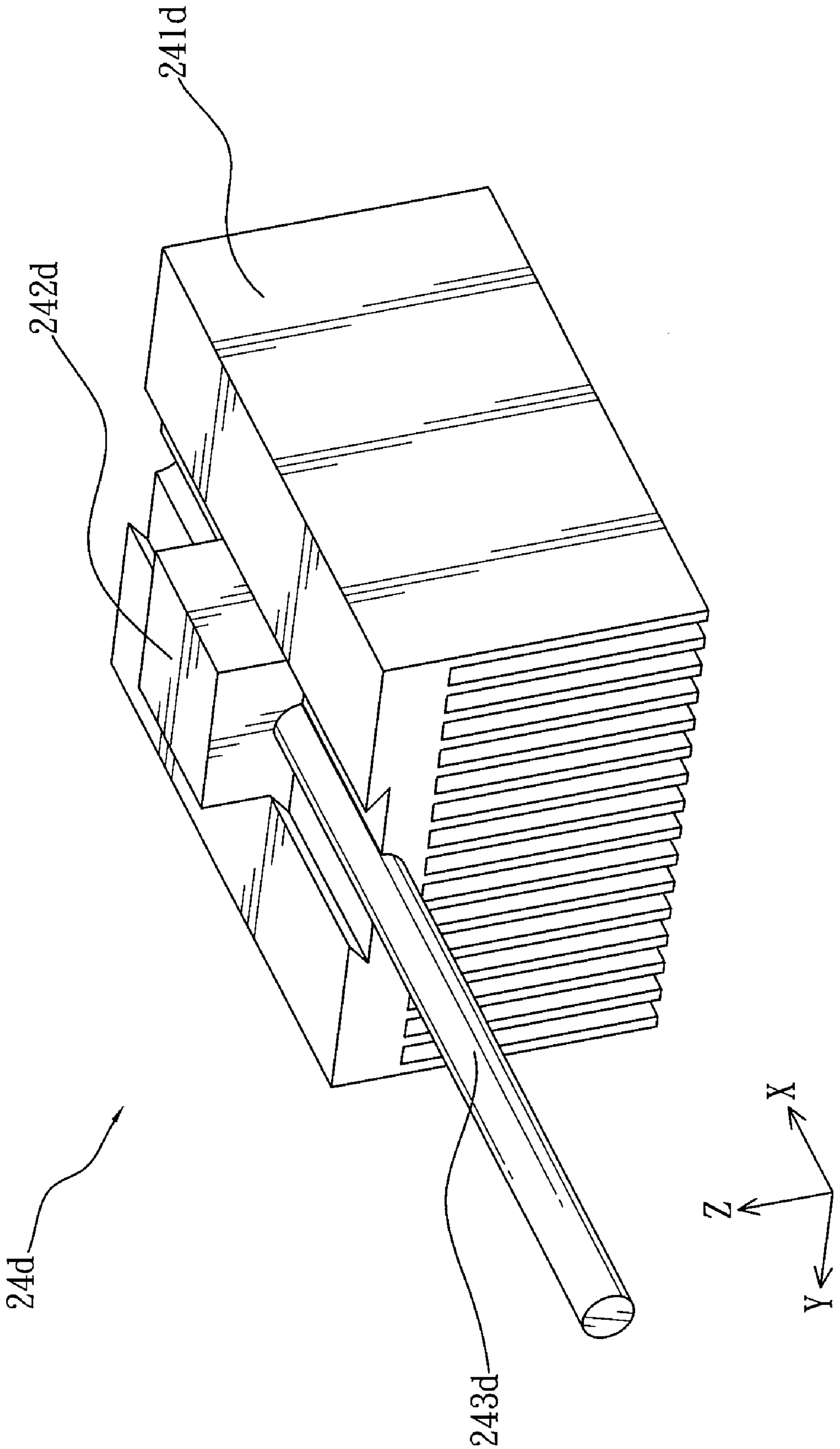
FIG. 5B is an assembled perspective view of the heat-dissipating structure according to the fourth preferred embodiment.
Figure 5C:
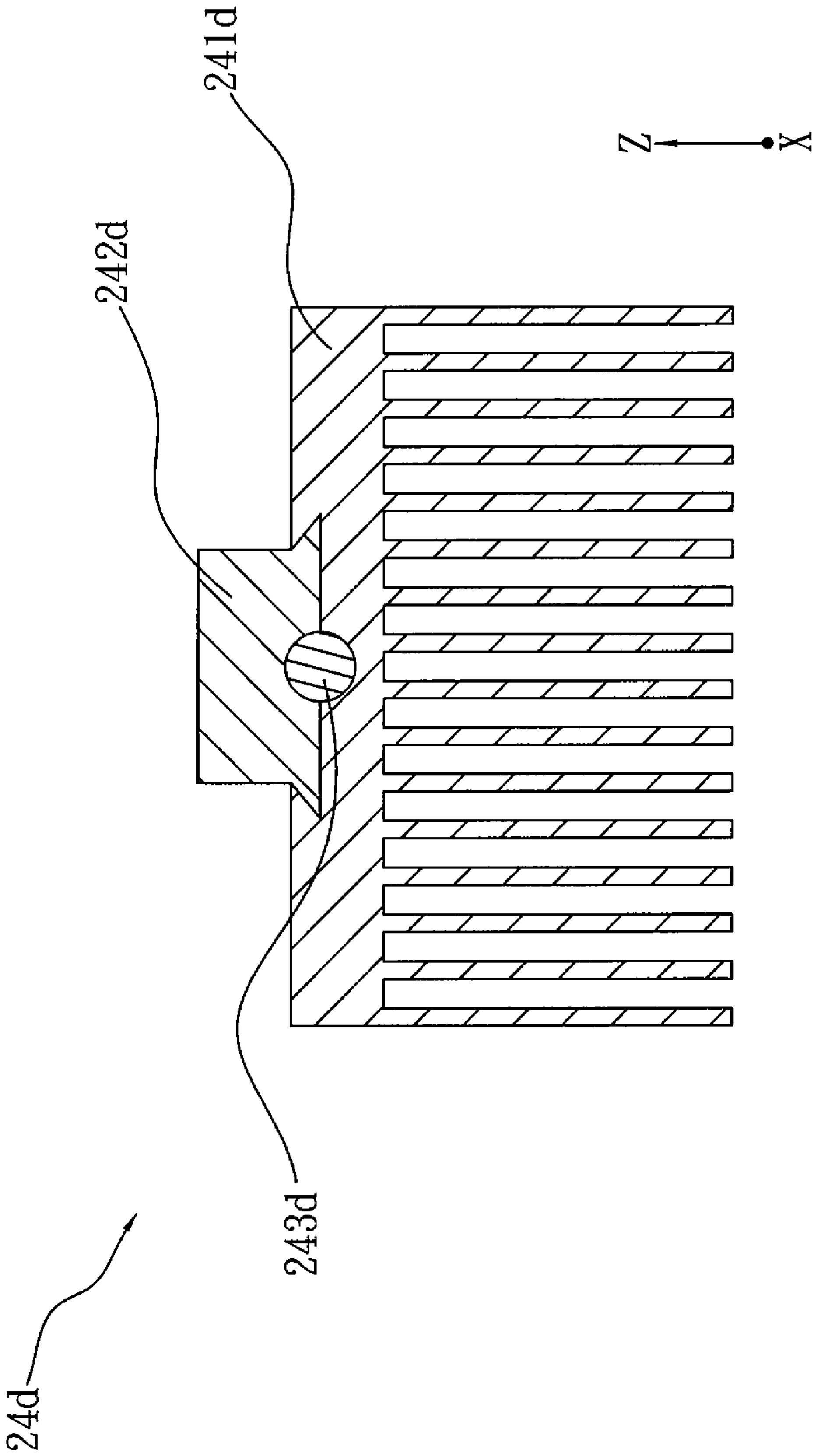
FIG. 5C is a sectional view of the heat-dissipating structure according to the fourth preferred embodiment.

With reference to FIG. 5A, FIG. 5B and FIG. 5C, a light valve device according to a fourth preferred embodiment of the present invention has some differences from the one according to the first preferred embodiment (shown in FIG. 3A and FIG. 3B). A heat-dissipating structure 24*d* of the fourth preferred embodiment further includes a heat-conducting tube 243*d*. The heat-conducting tube 243*d* includes first and second segments extending in the longitudinal direction (X). The first segment is disposed between the heat-dissipating main body 241*d* and the heat-dissipating block 242*d*. The second segment extends outside of the groove 2410*d* in the heat-dissipating main body 241*d*. In particular, the heat-dissipating structure 24*d* differs from the heat-dissipating structure 24 (shown in FIG. 3A) of the first preferred embodiment in the configurations of the first side 2415*d* of the heat-dissipating main body 241*d* and of the engaging portion 2420*d* of the heat-dissipating block 242*d*. The groove 2410*d* in the first side 2415*d* of the heat-dissipating main body 241*d* is configured not only to receive the engaging portion 2420*d* of the heat-dissipating block 242*d*, but is further configured to cooperate with a groove 2424*d* formed in the second engaging portion 2420*d* of the heat-dissipating block 242*d* at the second contacting surface 2421*d* to receive the heat-conducting tube 243*d*. Consequently, the heat-conducting tube 243*d* helps dissipate the heat generated by the light valve 21 (shown in FIG. 3A) outside of the heat-dissipating main body 241*d*. The heat-dissipating characteristic of the heat-conducting tube 243*d* enhances the heat-dissipating efficiency of the heat-dissipating structure 24*d*. The second segment of the heat-conducting tube 243*d* may also be coupled to heat-dissipating fins 2413 (not shown) to further enhance the heat-dissipating efficiency.

In sum, the light valve device according to the embodiments of the present invention has at least one of the following advantages:

1. Since the heat-dissipating main body 241 and the heat-dissipating block 242 of the heat-dissipating structure 24 are formed so that the groove 2410 in the first side 2415 of the heat-dissipating main body 241 corresponds in shape to the engaging portion 2420 of the heat-dissipating block 242, the heat-dissipating main body 241 and the heat-dissipating block 242 are engaged to each other without using any additional medium or component, thereby decreasing thermal resistance, enhancing structural durability, and enhancing heat-dissipating efficiency of the heat-dissipating structure 24.

2. Since the thermal conductivity of the heat-dissipating block 242 is greater than that of the heat-dissipating main body 241, heat energy generated by the light valve 21 is transferred quickly to the heat-dissipating main body 241 via the heat-dissipating block 242. The heat-dissipating structure 24 is low cost, lightweight, and efficient in heat dissipation as compared to the prior art.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the terms “the invention”, “the present invention” or the like do not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light valve device comprising:

a circuit board having a first surface, a second surface opposite to said first surface in a vertical direction, and a through hole extending from said first surface to said second surface;

a light valve disposed adjacent to said first surface of said circuit board; and a heat-dissipating structure including:

a heat-dissipating main body that has a first side disposed adjacent to said second surface of said circuit board and formed with a groove which is defined by a first contacting surface and two engaging surfaces, said first contacting surface extending in a longitudinal direction perpendicular to the vertical direction and having two longitudinal edges opposite to each other in a transverse direction perpendicular to the vertical and longitudinal directions, said engaging surfaces respectively extending from said longitudinal edges of said first contacting surface and defining an open side of said groove opposite to said first contacting surface in the vertical direction, said groove extending in the longitudinal direction through two opposite lateral sides of said heat-dissipating main body transverse to said first side, said open side of said groove having a width in the transverse direction smaller than that of said first contacting surface in the transverse direction, and a heat-dissipating block that includes an engaging portion and a heat-dissipating portion connected to said engaging portion, said engaging portion having a second contacting surface, and being disposed in said groove so that said second contacting surface is in contact with said first contacting surface of said first side of said heat-dissipating main body, said heat-dissipating portion extending through said first through hole in said circuit board toward said light valve.

2. The light valve device as claimed in claim 1, further comprising a valve-receiving seat that includes a seat wall, and a surrounding wall connected to and cooperating with said seat wall to define a valve-receiving space, said seat wall having a first face that faces said valve-receiving space, and a second face that is opposite to said first face in the vertical direction and that is disposed in contact with said first surface of said circuit board, said light valve being received in said valve-receiving space, being in contact with said first face, and being coupled electrically to said circuit board via said valve-receiving seat.

3. The light valve device as claimed in claim 2, wherein said seat wall is formed with a second through hole extending from said first face to said second face, and corresponding to said first through hole in said circuit board, said heat-dissipating portion of said heat-dissipating block further extending through said second through hole toward said light valve.

4. The light valve device as claimed in claim 1, further comprising a heat-conducting plate disposed between said light valve and said heat-dissipating portion of said heat-dissipating block.

5. The light valve device as claimed in claim 1, wherein said light valve is a digital micromirror device (DMD) unit.

6. The light valve device as claimed in claim 1, wherein said second contacting surface of said heat-dissipating block has an area smaller than that of said first side of said heat-dissipating main body.

7. The light valve device as claimed in claim 1, wherein said heat-dissipating main body further has a second side opposite to said first side in the vertical direction, and is provided with a plurality of heat-dissipating fins.

8. The light valve device as claimed in claim 1, wherein said heat-dissipating block has a thermal conductivity greater than that of said heat-dissipating main body.

9. The light valve device as claimed in claim 1, wherein said heat-dissipating block is made one of copper and silver, and said heat-dissipating main body is made of aluminum.

10. The light valve device as claimed in claim 1, wherein each of said engaging surfaces forms a wedge-shaped outline with said first contacting surface in a plane perpendicular to the longitudinal direction, and said engaging portion of said heat-dissipating block has two wedge-shaped projections respectively corresponding in shape to said wedge-shaped outlines formed by said engaging surfaces with said first contacting surface.

11. The light valve device as claimed in claim 1, wherein each of said engaging surfaces forms a fan-shaped outline with said first contacting surface in a plane perpendicular to the longitudinal direction, and said engaging portion of said heat-dissipating block has two fan-shaped projections respectively corresponding in shape to said fan-shaped outlines formed by said engaging surfaces with said first contacting surface.

12. The light valve device as claimed in claim 1, wherein each of said engaging surfaces forms a rectangular-shaped outline with said first contacting surface in a plane perpendicular to the longitudinal direction, and said engaging portion of said heat-dissipating block has two rectangular-shaped projections respectively corresponding in shape to said rectangular-shaped outlines formed by said engaging surfaces with said first contacting surface.

13. The light valve device as claimed in claim 1, wherein said groove in said heat-dissipating main body is a dovetail groove, and said engaging portion of said heat-dissipating block is a dovetail joint corresponding in shape to said dovetail groove.

14. The light valve device as claimed in claim 1, wherein said heat-dissipating structure further includes a heat-conducting tube that includes first and second segments, said first segment being disposed between said heat-dissipating main body and said heat-dissipating block, said second segment extending outside of said groove in said heat-dissipating main body.

* * * * *